(12) United States Patent
Graef (10) Patent No.: US 8,161,348 B2
(45) Date of Patent: Apr. 17, 2012

(54) SYSTEMS AND METHODS FOR LOW COST LDPC DECODING

(75) Inventor: Nils Graef, San Jose, CA (US)

(73) Assignee: Agere Systems Inc., Allentown, PA (US)

( * ) Notice: Subject to any disclaimer, the term of this patent is extended or adjusted under 35 U.S.C. 154(b) by 1108 days.

(21) Appl. No.: 12/025,924

(22) Filed: Feb. 5, 2008

(65) Prior Publication Data
US 2009/0199071 A1    Aug. 6, 2009

(51) Int. Cl.
*H03M 13/00* (2006.01)
(52) U.S. Cl. ............... 714/757; 714/752; 714/763
(58) Field of Classification Search .......... 714/757, 714/752, 763, 799, 780, 786, 801
See application file for complete search history.

(56) References Cited

U.S. PATENT DOCUMENTS

| | | | |
|---|---|---|---|
| 4,941,191 A * | 7/1990 | Miller et al. | 382/261 |
| 5,278,846 A | 1/1994 | Okayama et al. | |
| 5,325,402 A | 6/1994 | Ushirokawa | |
| 5,392,299 A | 2/1995 | Rhines et al. | |
| 5,513,192 A | 4/1996 | Janku et al. | |
| 5,612,964 A | 3/1997 | Haraszti | |
| 5,701,314 A | 12/1997 | Armstrong et al. | |
| 5,717,706 A | 2/1998 | Ikeda | |
| 5,844,945 A | 12/1998 | Nam et al. | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister et al. | |
| 6,023,783 A | 2/2000 | Divsalar et al. | |
| 6,029,264 A | 2/2000 | Kobayashi et al. | |
| 6,041,432 A | 3/2000 | Ikeda | |
| 6,097,764 A | 8/2000 | McCallister et al. | |
| 6,216,251 B1 | 4/2001 | McGinn | |
| 6,266,795 B1 | 7/2001 | Wei | |
| 6,317,472 B1 | 11/2001 | Choi et al. | |
| 6,351,832 B1 | 2/2002 | Wei | |
| 6,377,610 B1 | 4/2002 | Hagenauer et al. | |
| 6,438,717 B1 | 8/2002 | Butler et al. | |
| 6,473,878 B1 | 10/2002 | Wei | |

(Continued)

FOREIGN PATENT DOCUMENTS

WO    WO 2006/016751    2/2006

(Continued)

OTHER PUBLICATIONS

Yeo et al., "VLSI Architectures for Iterative Decoders in Magnetic Storage Channels", Mar. 2001, pp. 748-755, IEEE Trans. Magnetics, vol. 37, No. 2.

(Continued)

*Primary Examiner* — Fritz Alphonse
(74) *Attorney, Agent, or Firm* — Hamilton DeSanctis & Cha (57) ABSTRACT

Various embodiments of the present invention provide systems and circuits that provide for LDPC decoding and/or error correcting. For example, various embodiments of the present invention provide LDPC decoder circuits that include a soft-input memory, a memory unit, and an arithmetic unit. The arithmetic unit includes a hardware circuit that is selectably operable to perform a row update and a column update. In such cases, a substantial portion of the circuitry of the hardware circuit used to perform the row update is re-used to perform the column update.

23 Claims, 8 Drawing Sheets

U.S. PATENT DOCUMENTS

| | | |
|---|---|---|
| 6,625,775 B1 | 9/2003 | Kim |
| 6,671,404 B1 | 12/2003 | Kawatani et al. |
| 6,748,034 B2 | 6/2004 | Hattori et al. |
| 6,757,862 B1 | 6/2004 | Marianetti |
| 6,788,654 B1 | 9/2004 | Hashimoto et al. |
| 6,810,502 B2 | 10/2004 | Eidson |
| 6,986,098 B2 | 1/2006 | Poeppelman et al. |
| 7,010,051 B2 | 3/2006 | Murayama et al. |
| 7,047,474 B2 | 5/2006 | Rhee et al. |
| 7,058,873 B2 | 6/2006 | Song et al. |
| 7,093,179 B2 | 8/2006 | Shea |
| 7,184,486 B1 | 2/2007 | Wu et al. |
| 7,191,378 B2 | 3/2007 | Eroz et al. |
| 7,203,887 B2 | 4/2007 | Eroz et al. |
| 7,257,764 B2 | 8/2007 | Suzuki et al. |
| 7,310,768 B2 | 12/2007 | Eidson et al. |
| 7,451,376 B2 * | 11/2008 | Yoshida .................... 714/752 |
| 7,500,168 B2 * | 3/2009 | Yoshida .................... 714/752 |
| 7,836,383 B2 * | 11/2010 | Efimov et al. ................ 714/780 |
| 2004/0098659 A1 | 5/2004 | Bjerke et al. |
| 2005/0216819 A1 | 9/2005 | Chugg et al. |
| 2005/0273688 A1 | 12/2005 | Argon |
| 2006/0020872 A1 | 1/2006 | Richardson et al. |
| 2006/0031737 A1 | 2/2006 | Chugg et al. |
| 2006/0140311 A1 | 6/2006 | Ashley et al. |
| 2006/0168493 A1 | 7/2006 | Song et al. |
| 2006/0195772 A1 | 8/2006 | Graef et al. |
| 2006/0248435 A1 | 11/2006 | Haratsch |
| 2007/0047635 A1 | 3/2007 | Stojanovic et al. |
| 2007/0286270 A1 | 12/2007 | Huang et al. |
| 2008/0046801 A1 * | 2/2008 | Sugitani et al. ............... 714/801 |
| 2008/0049825 A1 | 2/2008 | Chen et al. |
| 2008/0168330 A1 | 7/2008 | Graef et al. |

FOREIGN PATENT DOCUMENTS

| | | |
|---|---|---|
| WO | WO 2006/091797 | 8/2007 |

OTHER PUBLICATIONS

Collins and Hizlan, "Determinate State Convolutional Codes" IEEE Transactions on Communications, Dec. 1993.

Eleftheriou, E. et al., "Low Density Parity Check Codes for Digital Subscriber Lines", Proc ICC 2002, pp. 1752-1757.

Han and Ryan, "Pinning Techniques for Low-Floor Detection/Decoding of LDPC-Coded Partial Response Channels", 5th International Symposium on Turbo Codes &Related Topics, 2008.

Mohsenin et al., "Split Row: A Reduced Complexity, High Throughput LDPC Decoder Architecture", pp. 1-6, printed from www.ece.ucdavis.edu on Jul. 9, 2007.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Zhong et al., "Area-Efficient Min-Sum Decoder VLSI Architecture for High-Rate QC-LDPC Codes in Magnetic Recording", pp. 1-15, Submitted 2006, not yet published.

Zhong, "Block-LDPC: A Practical LDPC Coding System Design Approach", IEEE Trans. On Circuits, Regular Papers, vol. 5, No. 4, pp. 766-775, Apr. 2005.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC Techron, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

Zhong et al. "Joint Code-Enforcer-Decoder Design for LDPC Coding System VLSI Implementation", Rensselaer Polytechnic Institute, Printed Apr. 2007 from www.ecse.rpi.edu.

* cited by examiner

SYSTEMS AND METHODS FOR LOW COST LDPC DECODING

BACKGROUND OF THE INVENTION

The present invention is related to systems and methods for decoding information, and more particularly to systems and methods for LDPC decoding using the sum product.

A number of encoding/decoding schemes have been developed to meet the needs for, among other things, data storage and data transmission. As one example, low-density parity-check (LDPC) codes have been developed that provide excellent error correcting performance using a highly parallelized decoding algorithm. Various implementations of an LDPC decoder implement a sum product algorithm.

Figure 1:
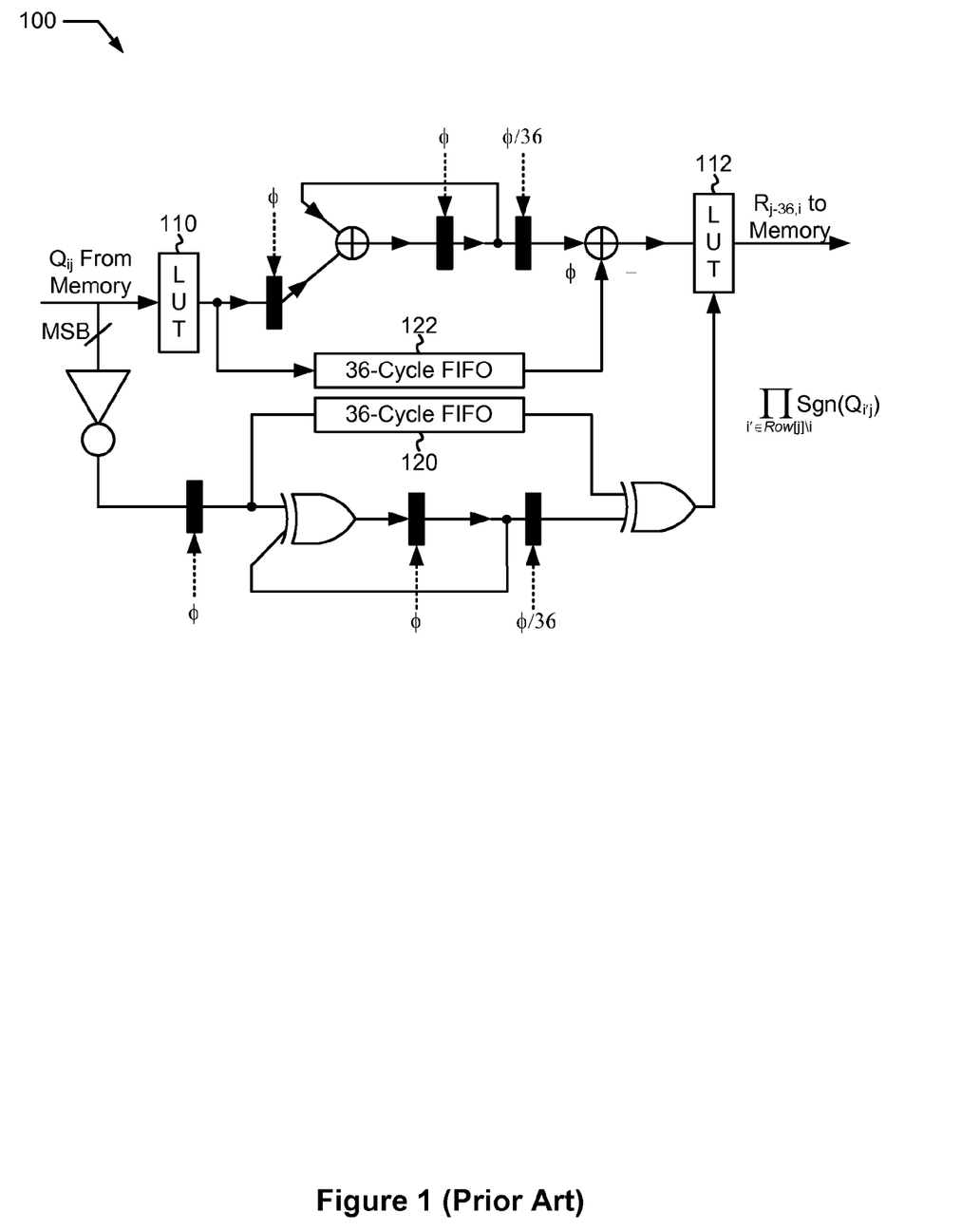
FIG. 1 depicts a prior art check-to-bit (i.e., row update) circuit.

Turning to FIG. 1, an exemplary prior art check-to-bit circuit (i.e., a row update circuit) 100 is depicted. In this example, the parity check matrix has columns of weight four and rows of weight thirty-six, and includes a total of 18,432 nonzero entries. The parity check information is also commonly represented in a bi-partite graph as five hundred, twelve (512) check nodes and four thousand, six hundred and eight (4608) bit nodes. Of note, the architecture includes two distinct look up tables 110, 112 and two distinct FIFO memories 120, 122 that are used to implement a sum product algorithm. In particular, the architecture of check-to-bit circuit 100 uses both look up tables 110, 112 at the same time during a row update. Such an architecture provides reasonable decode results, however, it is expensive in terms of circuitry and die area.

Hence, for at least the aforementioned reasons, there exists a need in the art for advanced systems and methods for decoding information.

BRIEF SUMMARY OF THE INVENTION

The present invention is related to systems and methods for decoding information, and more particularly to systems and methods for LDPC decoding using the sum product.

Some embodiments of the present invention provide LDPC decoders that include arithmetic units with a reconfigurable hardware circuit. The reconfigurable hardware circuit is selectably operable to perform a row update, a column update and a load/unload function. In some instances of the aforementioned embodiments, the LDPC decoder further includes a memory unit communicably coupled to the arithmetic unit. In such cases, the load/unload function is operable to simultaneously load soft inputs to a memory unit, and to unload soft outputs from the memory unit. In particular instances, the memory unit includes a dual port RAM, a counter and an address look-up table. In such instances, the dual port RAM is addressed directly from the counter during a column update and indirectly by applying an output from the counter to the address look-up table during a row update.

In various instances of the aforementioned embodiments, the LDPC decoder further includes a soft-input memory communicably coupled to the arithmetic unit. In such instances, the LDPC decoder is operable to receive a set of soft-inputs to both the soft-input memory and the arithmetic unit in parallel. In some cases, the soft-input memory is a FIFO. In some instances of the aforementioned embodiments, the arithmetic unit includes a set of look-up tables. This same look-up table is used to perform both the row update function and the column update function.

Other embodiments of the present invention provide methods for performing LDPC decoding. Such methods include providing an LDPC decoder that has an arithmetic unit, a soft-input memory, and a memory unit. The methods further include configuring the arithmetic unit to perform a row update and performing the row update, and configuring the arithmetic unit to perform a column update and performing the column update. In such cases, a substantial portion of the hardware used to perform the row update is re-used to perform the column update. In some particular cases, over one half of the circuitry used to perform the row update is re-used to perform the column update. In more particular cases, more than ninety-percent of the circuitry used to perform the row update is re-used to perform the column update. In one particular case, approximately all of the circuitry used to perform the row update is re-used to perform the column update.

In some instances of the aforementioned embodiments, the methods further include configuring the arithmetic unit to perform a load/unload function. In such instances, at least some of the circuitry used to perform the row update is re-used to perform the load/unload function. In particular instances, a substantial portion of the circuitry used to perform the row update is re-used to perform the load/unload function. In some cases, perform the load/unload function includes simultaneously loading soft-inputs into the memory unit and unloading soft-outputs from the memory unit.

In various instances of the aforementioned embodiments, the memory unit includes a dual port RAM. In such instances, performing a row update includes reading information from the memory unit using a counter to directly address the dual port RAM. In some instances, the memory unit further includes an address look-up table. In such instances, performing a column update includes reading information from the memory unit using a counter to indirectly address the dual port RAM via the address look-up table.

In other instances of the aforementioned embodiments, configuring the arithmetic unit to perform the row update includes selectably asserting inputs to one or more multiplexers of a reconfigurable hardware circuit. Configuring the arithmetic unit to perform the column update includes selectably asserting inputs to one or more multiplexers of a reconfigurable hardware circuit. In one or more instances of the aforementioned embodiments, the arithmetic unit includes a look-up table. In such instances, configuring the arithmetic unit to perform a row update and configuring the arithmetic unit to perform a column update result in using the same look-up table for both the column update and the row update.

Yet other embodiments of the present invention provide decoder circuits that include a soft-input memory, a memory unit, and an arithmetic unit. The arithmetic unit includes a hardware circuit that is selectably operable to perform a row update and a column update. In such cases, a substantial portion of the circuitry of the hardware circuit used to perform the row update is re-used to perform the column update. In some cases, at least half of the circuitry of the hardware circuit used to perform the row update is re-used to perform the column update. In various instances of the aforementioned embodiments, the hardware circuit is further selectably operable to perform a load/unload function. In such cases, the load/unload function includes a simultaneous loading of soft-inputs into the memory unit and unloading soft-outputs from the memory unit.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for decoding information, and more particularly to systems and methods for LDPC decoding using the sum product.

Figure 2:
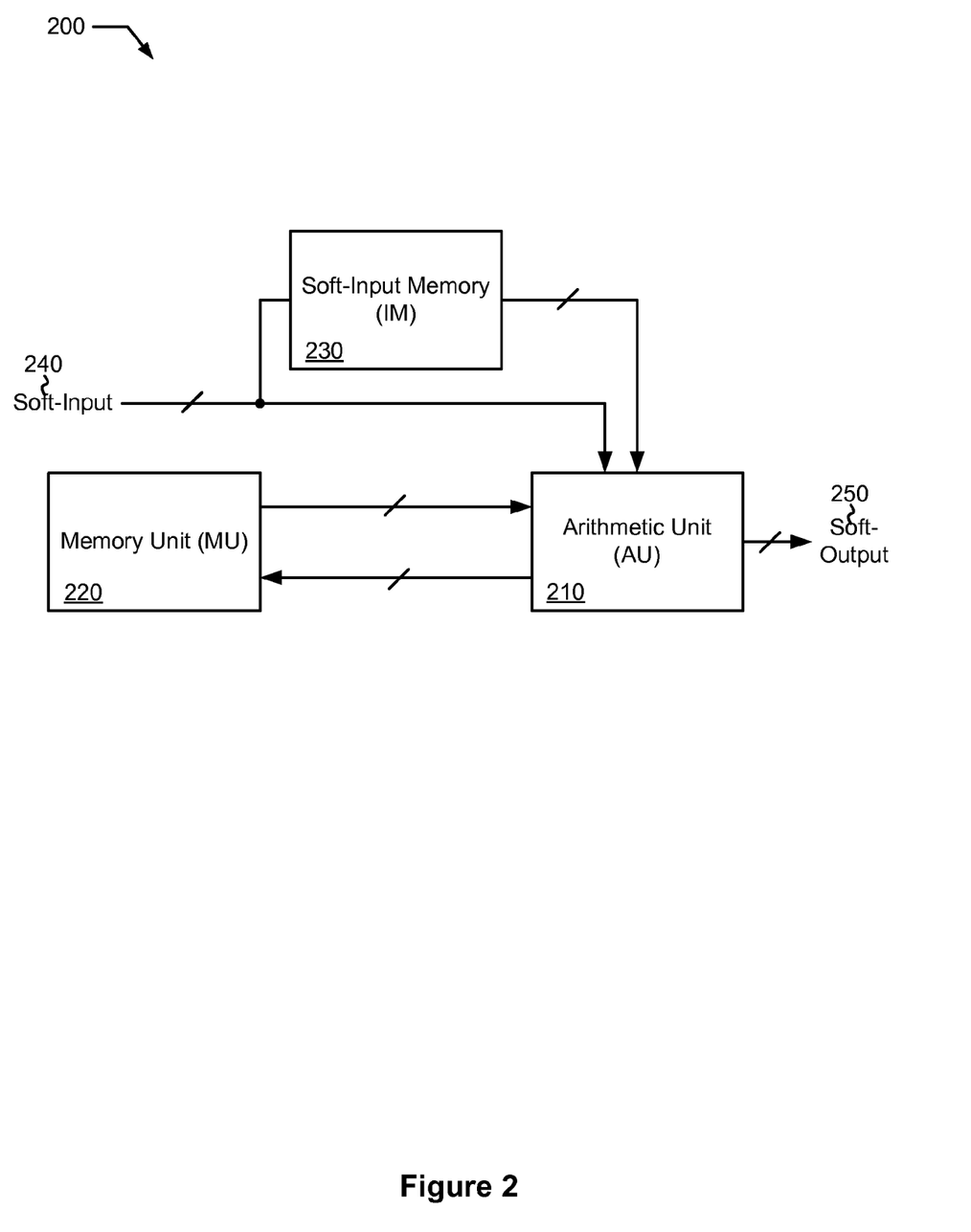
FIG. 2 depicts an LDPC decoder in accordance with some embodiments of the present invention.

Turning to FIG. 2, an LDCP decoder 200 in accordance with one or more embodiments of the present invention is depicted. In the decoder, a sum product algorithm is implemented where an arithmetic unit 210 is configurable to be shared between a row update function and a column update function. Such sharing results in a reduction in circuitry and die area including, but not limited to, utilization of fifty percent fewer look up tables when compared with other prior art LDPC decoders. As a particular example, LDCP decoder 200 uses only a single look up table compared to the two look up tables prescribed in Yeo et al., "VLSI Architectures for Iterative Decoders in Magnetic Recording Channels", IEEE Transactions on Magnetics, Vol. 37, March 2001. The entirety of the aforementioned reference is incorporated herein by reference for all purposes.

In addition, a memory unit 220 of LDCP decoder 200 is shared between row and column update circuitry. Thus, memory unit 220 stores only 'w' messages, where w is the number of 1s of the parity check matrix. Yet further, LDPC decoder 200 provides for writing soft-input values 240 into a soft-input memory 230 at the same time that soft-outputs 250 of the previously decoded codeword are provided. Soft-input memory 230 may be implemented as a simple buffer or FIFO that stores the prescribed number of soft-inputs. Alternatively, it may be implemented using a single-port RAM whose width is a number of times that of the bit-width of the soft-inputs. During column update, the stored soft-inputs are read from this memory in the same order as they are received. Therefore, the address generation sequence is identical for read and write. The address generation can be implemented either by a x-bit counter or, to save some area, by a x-bit LFSR. Note that in some implementations, soft-input memory 230 is always accessed in the same order (i.e. address 1, address 2, address 3, . . . address n). In such cases, soft-input memory 230 does not need the full random access flexibility of a RAM, and thus may be implemented by SAMs (sequential access memories) which require less area and power than RAMs.

In one particular embodiment of the present invention, the parity check matrices supported by LDPC decoder 200 are defined by the following parameters:
    n=4608 and k=4096 resulting in a code rate r=k/n=8/9=0.89; and
    a 512×4608 parity check matrix 'H' with a column weight equal to four and a row weight equal to thirty-six.
Accordingly, H contains 18,432 1s (i.e., 4608*4), which correspond to 18,432 messages of the iterative belief propagation algorithm. These messages are stored in memory unit 220, and are denoted as $m_{i,j}$, where any particular $m_{i,j}$ corresponds to the 1 that is located at row j and column of the parity check matrix.

Such LDPC decoders can support LDPC codes whose parity check matrix is decomposed into nine 512×512 sub-matrices with each sub-matrix having a row weight of four and a column weight of four (i.e., 36/9). The parity check matrix may be composed by interleaving the columns of the nine sub-matrices such that the first nine columns of the parity check matrix are equivalent to the first column of each of the respective sub-matrices as follows:
    Column 1 of H equals column 1 of the first sub-matrix;
    Column 2 of H equals column 1 of the second sub-matrix;
    Column 3 of H equals column 1 of the third sub-matrix;
    Column 4 of H equals column 1 of the fourth sub-matrix;
    Column 5 of H equals column 1 of the fifth sub-matrix;
    Column 6 of H equals column 1 of the sixth sub-matrix;
    Column 7 of H equals column 1 of the seventh sub-matrix;
    Column 8 of H equals column 1 of the eighth sub-matrix; and
    Column 9 of H equals column 1 of the ninth sub-matrix.
Each of the following set of nine columns of the parity check matrix corresponds to subsequent columns of the sub-matrices as follows:
    Column 10 of H equals column 2 of the first sub-matrix through column 18 of H equals column 2 of the ninth sub-matrix;
    Column 19 of H equals column 3 of the first sub-matrix through column 27 of H equals column 3 of the ninth sub-matrix;
    Column 28 of H equals column 4 of the first sub-matrix through column 36 of H equals column 4 of the ninth sub-matrix; and
    So on up to column 4608 of H.
    It should be noted that there are many codes (including quasi-cyclic LDPC codes) whose parity check matrix can be decomposed into nine sub-matrices where H=[$H_1$ $H_2$ $H_3$ . . . $H_9$]. In such cases, the 512×512 sub-matrices may have a column weight of four and row weight of four. Such codes can be mapped onto the proposed architecture by simple column permutation (i.e. interleaving) of the parity check matrix. In some cases, each sub-matrix (i.e., Hi) is constrained as:

$$H_i = H_{i,1} + H_{i,2} + H_{i,3} + H_{i,4},$$

where each $H_{i,j}$ is a 512×512 matrix with column weight of one and row weight of one. In such a case, locations of the 1s of the four matrices $H_{i,1}$, $H_{i,2}$, $H_{i,3}$, $H_{i,4}$ are non-overlapping. This results in thirty-six 512×512 matrices (i.e., 9*4) each with a column weight of one and row weight of one. Each of these thirty-six matrices may be mapped onto a single memory as more dully discussed below. The foregoing is merely an example of a parallel architecture capable of processing thirty-six messages in parallel (i.e., for a code with column weight of four and row weight of thirty-six, one entire row may be processed in parallel for the row update, or nine columns in parallel for the column update). It should be noted that the design may be scaled for higher or lower throughput and for different column and row weights depending upon the particular design constraints.

Figure 3:
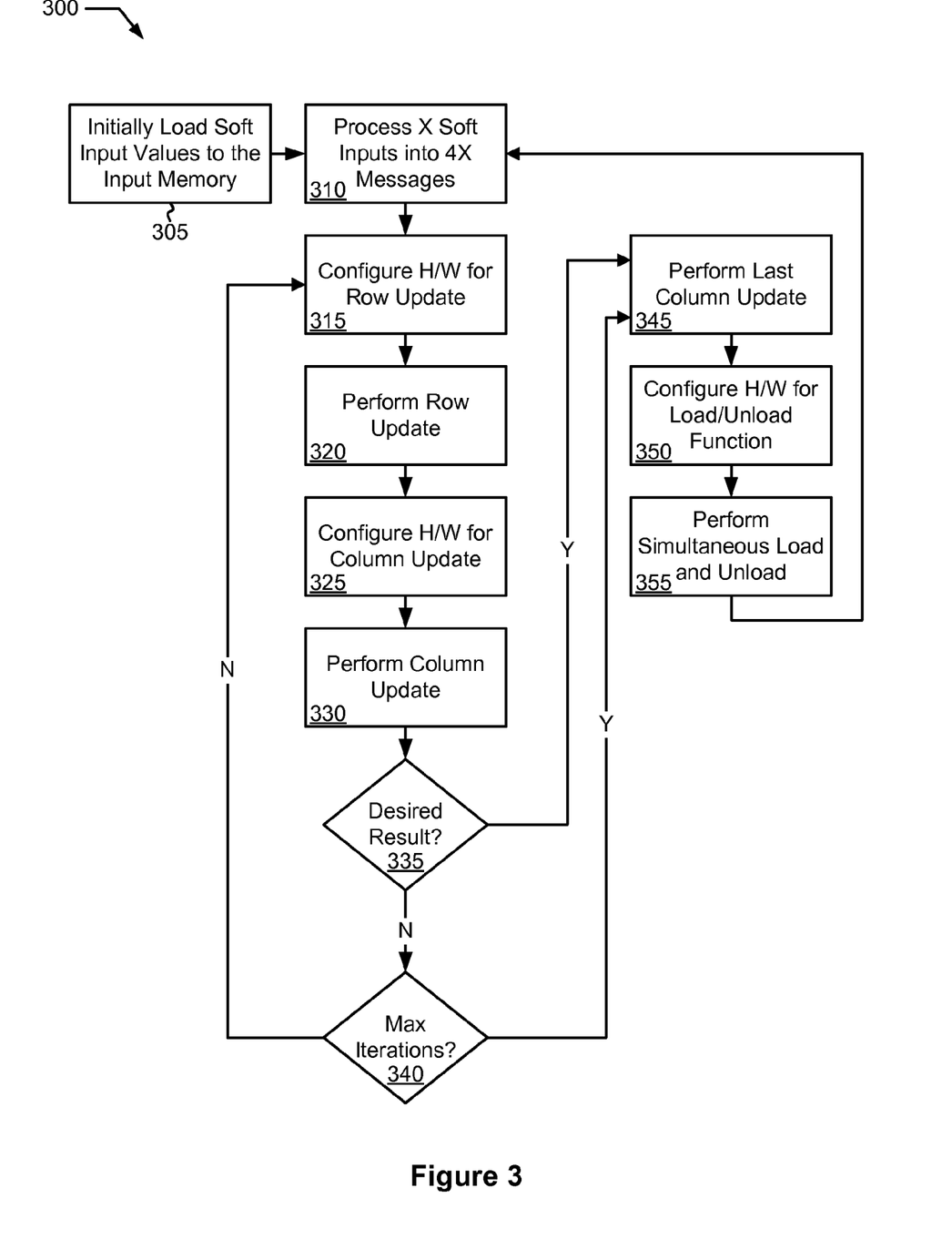
FIG. 3 is a flow diagram depicting operation of an LDPC decoder in accordance with some embodiments of the present invention.

Turning to FIG. 3, a flow diagram 300 depicts operation of an LDPC decoder in accordance with some embodiments of the present invention. Following flow diagram 300, an initial set of soft input values are loaded into soft-input memory 230 and to arithmetic unit 210 (block 305). Using the preceding example, the number of soft-inputs that are loaded is four thousand, six hundred, eight (4608). In one embodiment, nine soft inputs are processed by arithmetic unit 210 during each clock cycle resulting in thirty-six messages that are stored back to memory unit 220. In such an example, five hundred, twelve clock cycles are required to load the 4608 soft-inputs at nine per clock cycle. The aforementioned processing by arithmetic unit 210 includes mapping each of the received soft-inputs onto four messages (block 310) as defined by the following equation:

$$m_{j,i} = L_{input,i}, \text{ where } L_{input,i} \text{ are the soft-input values of the LDPC decoder.}$$

The hardware of the LDPC decoder is configured to perform a row update (block 315), and the row update is performed (block 320). Various embodiments of the present invention reuse common circuitry to perform row updates, column updates and load/unload functions. Configuring the hardware to perform a row update includes selectably configuring the hardware such that it is tailored to perform a row update. As part of the row update, memory unit 220 sends the messages of one entire row (e.g., from the example above this would be thirty-six messages) to arithmetic unit 210, which updates these messages and returns them to memory unit 220.

The following equation describes one exemplary row update procedure that may be used in relation to different embodiments of the present invention. In particular, for each row (e.g., for j=1 to 512), the magnitudes and signs of the thirty-six messages ($m_{i,j}$) corresponding to row j are updated as follows, where sgn(x)−1 if x<0 and sgn(x)=+1 otherwise:

$$|m_{j,i}| \leftarrow \phi\left(\sum_{i' \in Row[j]\backslash i} \phi(|m_{j,i'}|)\right)$$

$$\text{sgn}(m_{j,i}) \leftarrow \prod_{i' \in Row[j]\backslash i} \text{sgn}(m_{j,i'})$$

Using the example above where H has five hundred, twelve (512) rows, the process of performing a row update takes five hundred, twelve (512) clock cycles. Based on the disclosure provided herein, one of ordinary skill in the art will recognize that the process can be applied to matrices with different numbers of rows. As more fully discussed below, the Φ function expressed in the equation below may be implemented by a set of look-up tables:

$$\phi(x) = -\log(\tan h(x/2)).$$

After the row update is complete (block 320), the hardware of the LDPC decoder is re-configured to perform a column update (block 325) and the column update is performed (block 330). Configuring the hardware to perform a column update includes selectably configuring the hardware such that it is tailored to perform a column update. As part of the column update, memory unit 220 sends the messages of a number of columns (e.g., in the example messages associated with nine columns are sent) to arithmetic unit 210, which updates these messages and returns them to memory unit 220. Simultaneously, for each clock cycle, the soft-input memory sends nine soft-input values (i.e., $L_{input,i}$) to arithmetic unit 210.

The following equation describes one exemplary column update procedure that may be used in relation to different embodiments of the present invention. In particular, for each column (e.g., j=1 to 512), the four messages corresponding to a given column i are updated as:

$$m_{j,i} \leftarrow L_{input,i} + \sum_{j' \in Col[i]\backslash j} m_{j',i}$$

Using the example above where H has four thousand, six hundred, eight (4608) columns, the process of performing a column update takes five hundred, twelve (512) clock cycles (i.e., 4608/9=512). Based on the disclosure provided herein, one of ordinary skill in the art will recognize that the process can be applied to matrices with different numbers of columns.

At this point, it is determined whether a desired result has been achieved (block 335) or whether a maximum number of iterations has been exhausted (block 340). Where both the desired result has not been achieve (block 335) and the maximum number of iterations has not been exhausted (block 340), the processes of blocks 315 through 330 are repeated. Alternatively, where either the desired result has been achieved (block 335) or the maximum number of iterations has been exhausted (block 340), a final column update is performed (block 345). This column update is similar to that described above in relation to blocks 325 through 330 except that arithmetic unit 210 does not return the messages to memory unit 220. Instead, arithmetic unit 210 generates soft-output values that are forwarded as the output of the LDPC decoder. This is caused by re-configuring the hardware of the LDPC decoder to perform a simultaneous unload and load function (block 350). Each of the aforementioned soft-output values are provided from arithmetic unit 210 as soft-outputs as set forth in the following equation:

$$L_{output,i} = L_{input,i} + \sum_{j \in Col[i]} m_{j,i}$$

Simultaneous with this "unloading" process of producing soft-output values from arithmetic unit 210, a new set of soft-input values are loaded into memory unit 220 (block 355). This process of loading and unloading (block 355) is done in parallel with the processing of the last column update (block 345) of the subsequent set of messages.

Using the example described above, each iteration of the LDPC decoder (i.e., blocks 315-345) is completed in one thousand, twenty-four (1024) clock cycles. As the loading and unloading processes are completed in parallel with the processing of the last column update, no additional clock cycles are required for loading and unloading.

Figure 4:
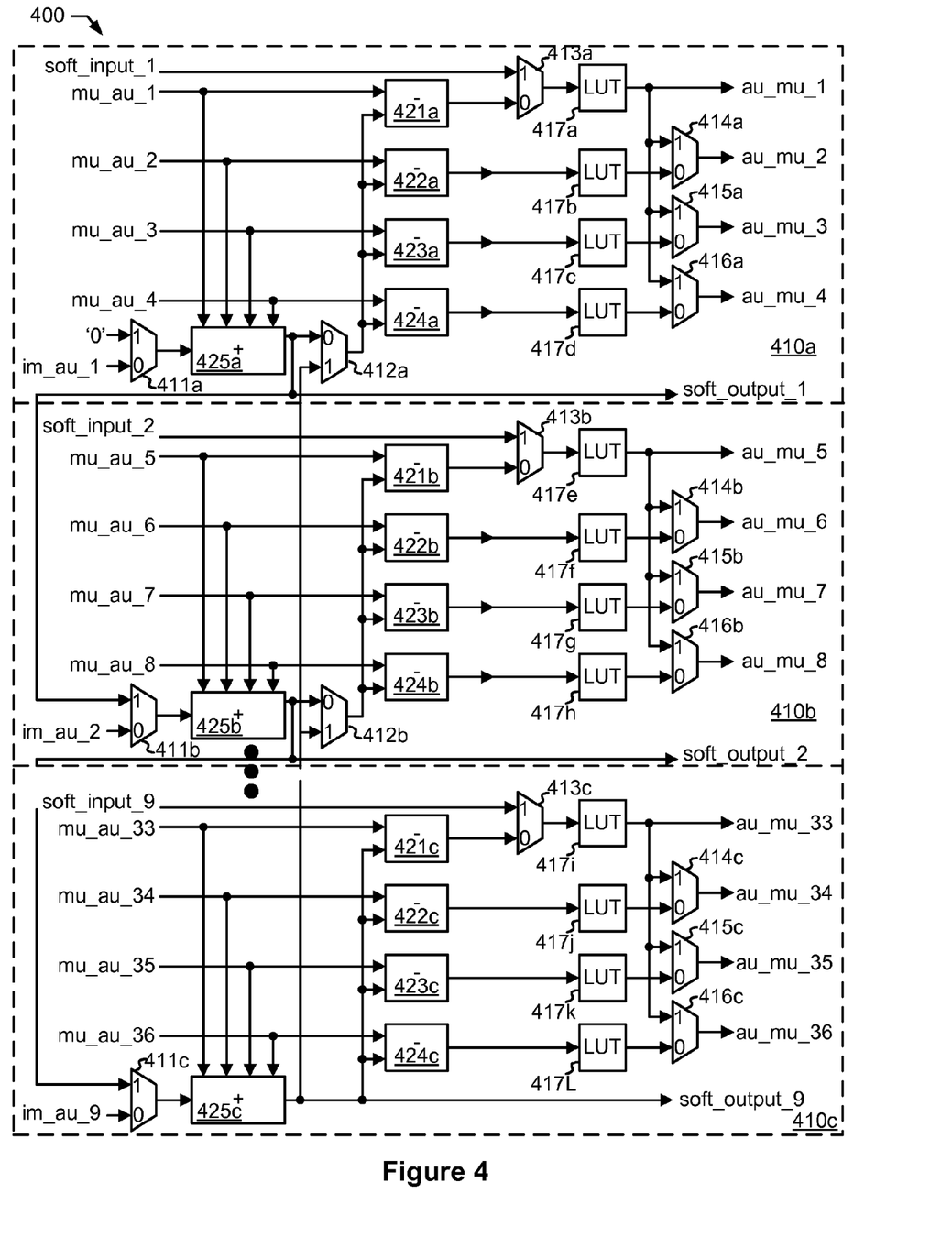
FIG. 4 shows a reconfigurable hardware set that provides for row update, column update, and load/unload functionality in accordance with some embodiments of the present invention.

As described above, arithmetic unit 210 is capable of being reconfigured to perform the various functions demanded of the LDPC decoder. In particular, arithmetic unit 210 is capable being reconfigured to performing a row update, a column update and a load and unload function. Turning to FIG. 4, a reconfigurable hardware set 400 is shown that may be selectably re-configured to perform the aforementioned functions in accordance with some embodiments of the present invention. Reconfigurable hardware set 400 includes a number of parallel circuits 410. One particular embodiment of the present invention includes nine parallel circuits 410 corresponding to the number of soft-inputs processed on a given clock cycle. Thus, where more or fewer soft-inputs are to be processed on any given clock cycle, a corresponding number of parallel circuits may be chosen. Each parallel circuit 410 includes a set of look-up tables 417 that is shared across parallel circuits 410, and a number of multi-input arithmetic function units 421, 422, 423, 424, 425. The configuration of the aforementioned look up table and arithmetic function units is controlled by selection of a number of multiplexers 411, 412, 413, 414, 416. In particular, selection of multiplexers 411, 412, 413, 414, 416 allows for configuring reconfigurable hardware set 400 to implement the following equation for loading corresponding to block 305 discussed above in relation to FIG. 3:

$$|m_{j,i}| = \phi(|L_{input,i}|)$$

$$sgn(m_{j,i}) = sgn(L_{input,i})$$

Further, selection of multiplexers 411, 412, 413, 414, 416 allows for configuring reconfigurable hardware set 400 to implement the following equation for row updates corresponding to blocks 315-320 discussed above in relation to FIG. 3:

$$|m_{j,i}| \leftarrow \phi\left(\sum_{i' \in Row[j]\backslash i} |m_{j,i'}|\right)$$

$$sgn(m_{j,i}) \leftarrow \prod_{i' \in Row[j]\backslash i} sgn(m_{j,i'})$$

Additionally, selection of multiplexers 411, 412, 413, 414, 416 allows for configuring reconfigurable hardware set 400 to implement the following equation for row updates corresponding to blocks 315-320 discussed above in relation to FIG. 3:

$$|m_{j,i}| \leftarrow \phi\left(\left|L_{input,i} + \sum_{j' \in Col[i]\backslash j} m_{j',i}\right|\right)$$

$$sgn(m_{j,i}) \leftarrow sgn\left(L_{input,i} + \sum_{j' \in Col[i]\backslash j} m_{j',i}\right)$$

Again, the function $\phi(x) = -\log(\tan h(x/2))$ may be implemented by the set of look-up tables 417. The set of look-up tables may be either implemented by synthesized combinational logic or by a ROM depending upon particular design constraints. As $\phi^{-1}(x) = \phi(x)$ for x>0, the function range and function domain of $\phi(x)$ are the same (i.e., the input and output values of the LUT have the same bit-width). Thus, storing $\phi(x)$ takes the same amount of memory bits as storing x would take. In some embodiments of the present invention, arithmetic unit 210 exploits this fact to reduce the number of required look-up tables by using the preceding equations. In some cases, messages are stored to memory unit 220 in sign-magnitude representation. The messages from memory unit 220 to arithmetic unit 210 are designated by the notation mu_au_x, where x is a number from one to the total messages. The messages from arithmetic unit 210 to memory unit 220 are designated by the notation au_mu_y, where y is a number from one to the total messages. The soft-inputs are designated by the notation soft_input z, where z is a number between one and the total number of soft-inputs per clock cycle. Further, inputs from soft-input memory 230 are designated as im_au_w, where w is a number between 1 and the total number of inputs form soft-input memory 230 for a given clock cycle.

Figure 5:
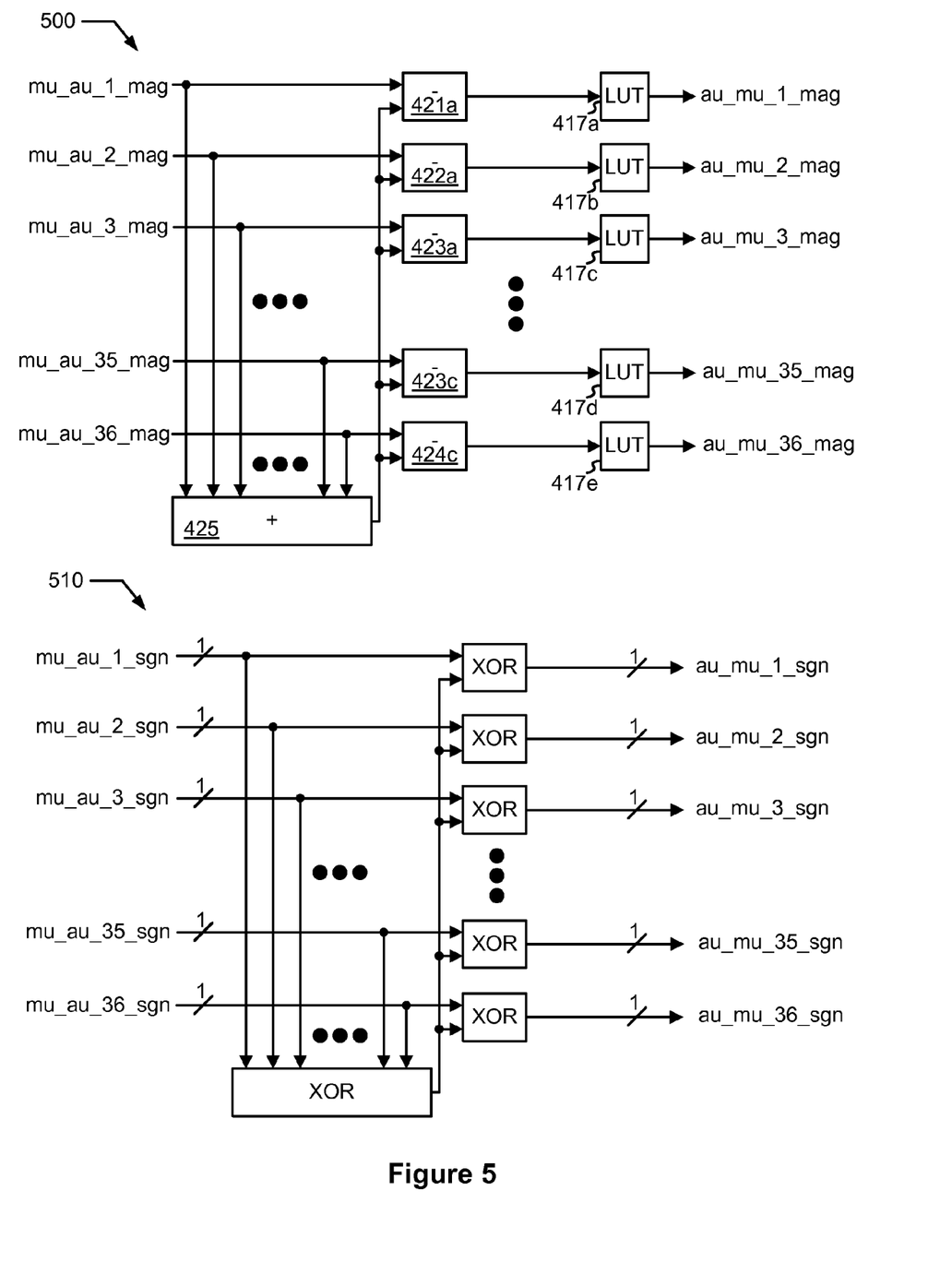
FIG. 5 depicts the reconfigurable hardware of FIG. 4 configured to perform a row update in accordance with various embodiments of the present invention.

Turning to FIG. 5, multiplexers 411, 412, 413, 414, 416 of reconfigurable hardware set 400 are selected such that the hardware is configured to perform a row update. In particular, in a circuit 500, multiplexers 411 are selected such that the output of the preceding stage is fed forward to the subsequent stage (e.g., parallel circuit 410a to parallel circuit 410b) resulting in an addition of all inputs by a combination of arithmetic function units 425. Multiplexers 412 are selected such that a subtraction of the aggregate from arithmetic function units 425 is taken from each of the incoming messages by a combination of arithmetic function units 421, 422, 423, 424. Multiplexers 413 are selected such that the arithmetically manipulated messages from memory unit 220 to arithmetic unit 210 are selected for addressing the set of look-up tables 417. In addition, multiplexers 414, 415, 416 are selected such that the output of the set of look-up tables 417 is directed back to memory unit 220 for storage. The sign function of the row update is performed by X-ORing the various memory unit 220 to arithmetic unit 210 messages together, and then X-Oring each of the memory unit 220 to arithmetic unit 210 signals with the result thereof as shown in a circuit 510. Such a configuration results in an implementation of the previously described row update equations with circuit 500 performing the magnitude function, and circuit 500 performing the sign function:

$$|m_{j,i}| \leftarrow \phi\left(\sum_{i' \in Row[j]\backslash i} |m_{j,i'}|\right)$$

$$sgn(m_{j,i}) \leftarrow \prod_{i' \in Row[j]\backslash i} sgn(m_{j,i'})$$

Figure 6:
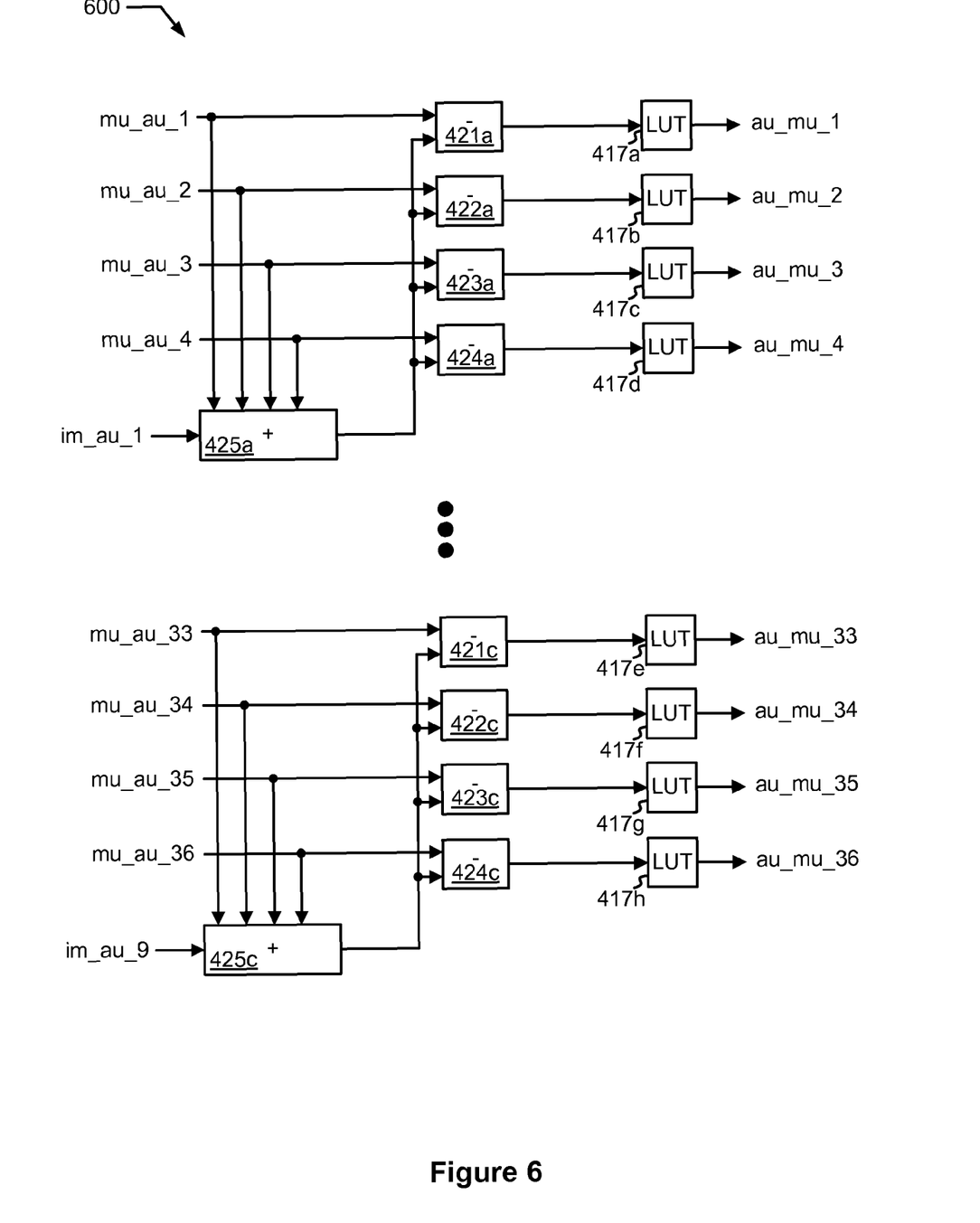
FIG. 6 depicts the reconfigurable hardware of FIG. 4 configured to perform a column update in accordance with one or more embodiments of the present invention.

Turning to FIG. 6, multiplexers 411, 412, 413, 414, 416 of reconfigurable hardware set 400 are selected such that the hardware is configured to perform a column update. In particular, in a circuit 600, multiplexers 411 are selected such that input messages from soft-input memory 230 are aggregated with messages from memory unit 220 to arithmetic unit 210 by a combination of arithmetic function units 425. Multiplexers 412 are selected such that a subtraction of the aggregate from arithmetic function units 425 is taken from each of the incoming messages by a combination of arithmetic function units 421, 422, 423, 424. Multiplexers 413 are selected such that the arithmetically manipulated messages from memory unit 220 to arithmetic unit 210 are selected for addressing the set of look-up tables 417. In addition, multiplexers 414, 415, 416 are selected such that the output of the set of look-up tables 417 is directed back to memory unit 220 for storage. The sign function is implemented similar to that of circuit 510 shown above. Such a configuration results in an implementation of the previously described column update equations:

$$|m_{j,i}| \leftarrow \phi\left(\left|L_{input,i} + \sum_{j' \in Col[i]\backslash j} m_{j',i}\right|\right)$$

-continued $$\text{sgn}(m_{j,i}) \leftarrow \text{sgn}\left(L_{input,i} + \sum_{j' \in Col[i] \setminus j} m_{j',i}\right)$$

Figure 7:
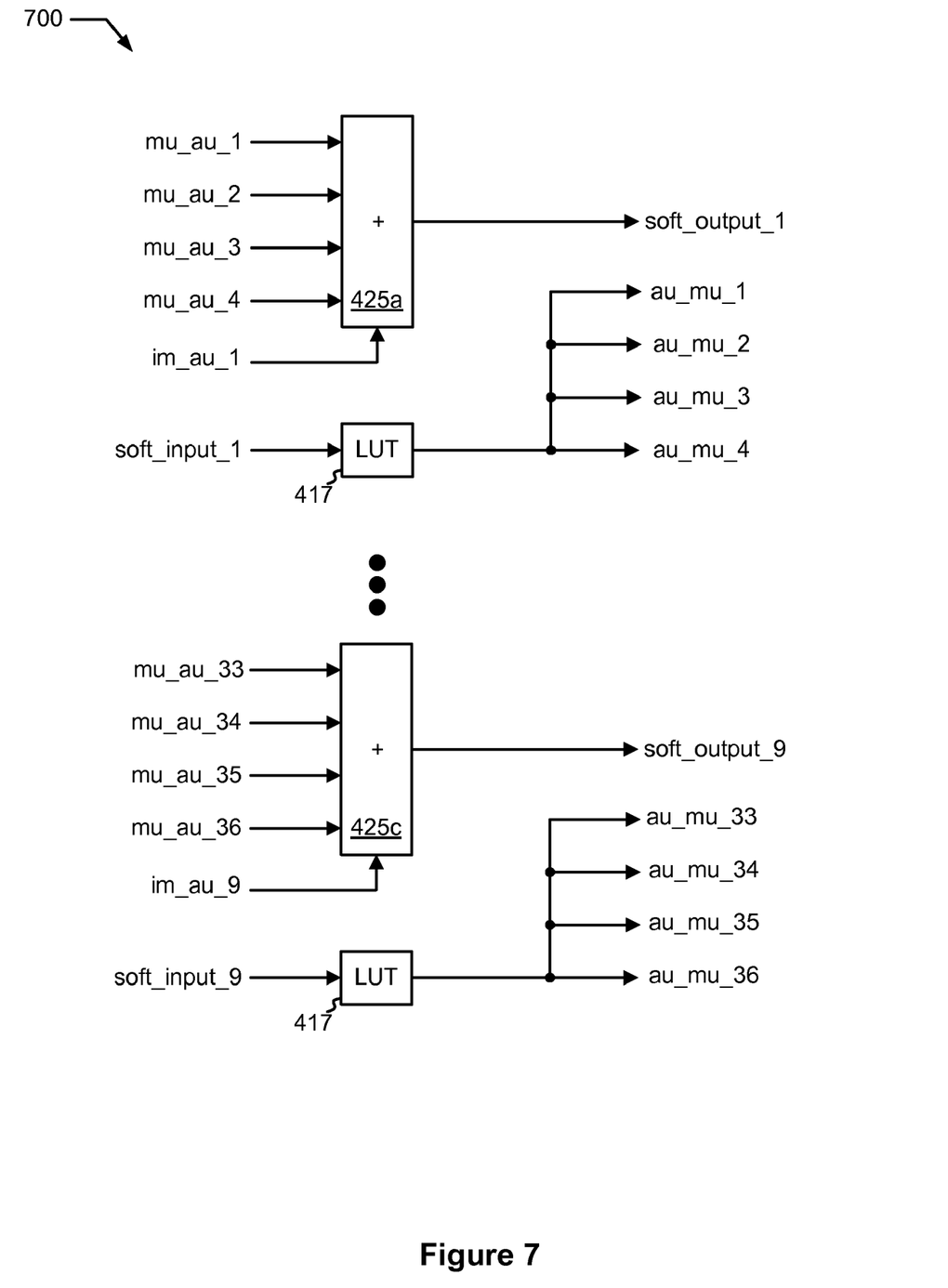
FIG. 7 depicts the reconfigurable hardware of FIG. 4 configured to perform a load/unload function in accordance with various embodiments of the present invention.

Turning to FIG. 7, multiplexers 411, 412, 413, 414, 416 of reconfigurable hardware set 400 are selected such that the hardware is configured to perform a load/unload function. In particular, in a circuit 700, multiplexers 411 are selected such that input messages from soft-input memory 230 are aggregated with messages from memory unit 220 to arithmetic unit 210 by a combination of arithmetic function units 425. This is provided as a soft output. Multiplexers 413 are selected such that soft inputs are used to address the set of look-up tables 417, and multiplexers 414, 415, 416 are selected such that the output of the set of look-up tables 417 based on the applied soft input is directed back to memory unit 220 for storage. Such a configuration results in an implementation of the previously described loading and unloading equations:

$$|m_{j,i}| = \phi(|L_{input,i}|)$$

$$\text{sgn}(m_{j,i}) = \text{sgn}(L_{input,i})$$

Such a hardware implementation provides for simultaneous loading and unloading. It should be noted that the above mentioned circuits of FIGS. 5-7 may be optimized for speed by inclusion of, for example, pipeline registers and other speed enhancing architectures as are known in the art.

Figure 8:
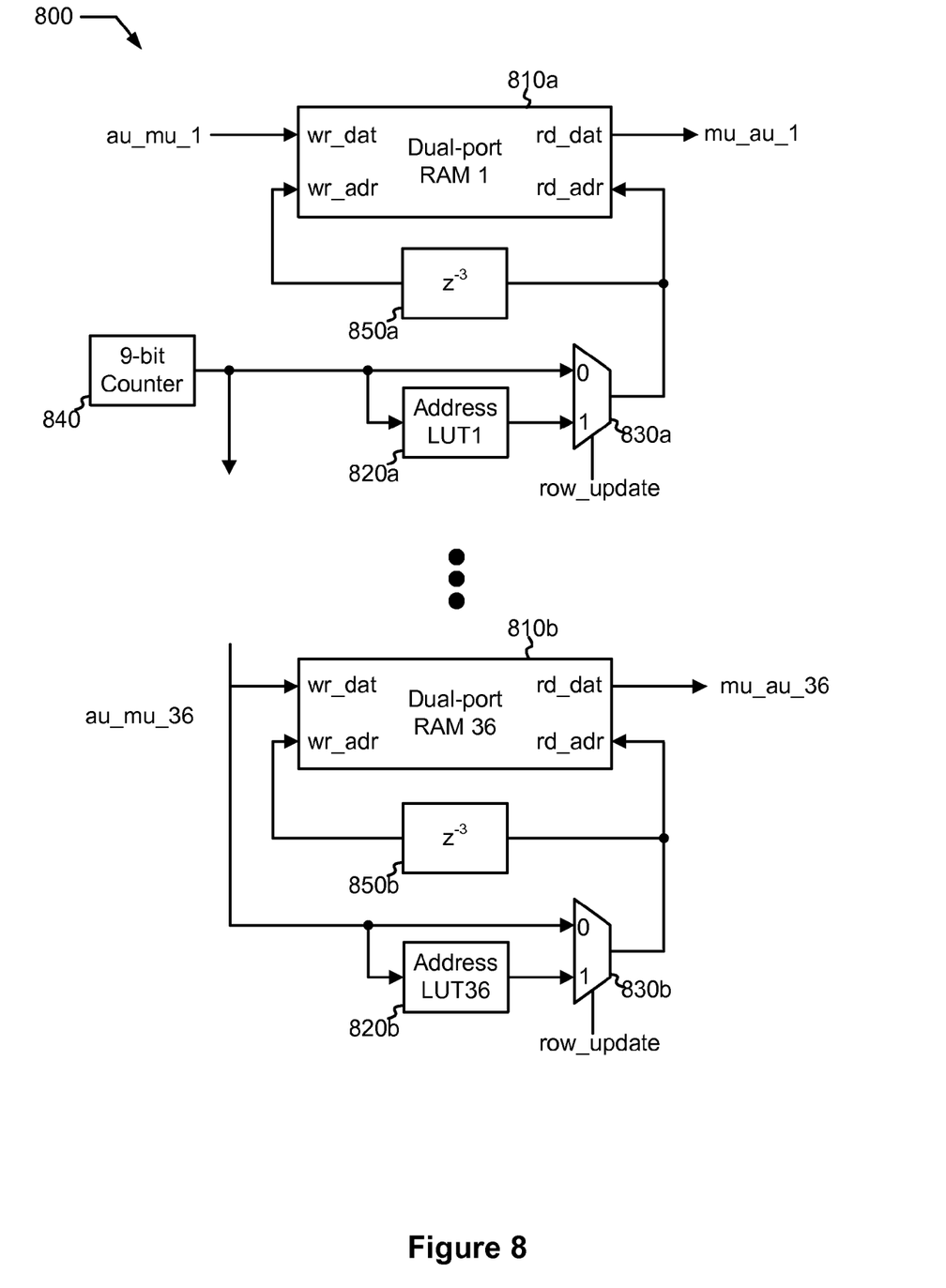
FIG. 8 depicts a dual port memory design that may be used in relation to different embodiments of the present invention.

Where, for example, the parity check matrix H is decomposed into thirty-six 512×512 sub-matrices with row and column weights of one, each of the thirty-six sub-matrices may be mapped onto a single RAM. In such a case, each RAM stores all five hundred, twelve messages that correspond to its respective sub-matrix. Turning to FIG. 8, a dual port memory design 800 is depicted that may be used to implement memory unit 220 capable of storing the above mentioned parity check matrix. As shown, dual port memory design 800 uses thirty-six dual-port RAMs 810 and address look-up tables 820. Each dual-port RAM has a read and a write port, which are used to simultaneously read and write. The write port contains the write-data input "wr_dat" and the write address input "wr_adr". Similarly, the read port contains the read-data output "rd_dat" and the read address input "rd_adr".

During a column update (blocks 325-330 of FIG. 3), a row update signal to multiplexers 830 is asserted low and read addresses to the dual port RAMs 810 are generated by a nine bit counter 840. For each clock cycle, a new address is generated by counter 840 and dual port RAMs 810 provide the memory contents of that address to arithmetic unit 210. Here, we assume that arithmetic unit 210 has a latency of three clock cycles. Thus, after three clock cycles, arithmetic unit 210 sends the updated column data back to dual port RAMs 810 (i.e., memory unit 220) where the data is stored at the same address where the original column data was stored. Therefore, the write addresses of dual port RAMs 810 are generated by delaying the read addresses by three clock cycles. This delay may be implemented as a series of registers 850.

During a row update (blocks 315-320 of FIG. 3), the row update signal to multiplexers 830 is asserted high. In this configuration, addresses to dual port RAMs 810 are generated by address look-up tables 820. Address look-up tables 820 can be implemented by LFSRs. For more random LDPC codes, address look-up tables 820 can be either implemented by synthesized combinational logic or by ROMs. In the latter case, multiple look-up tables can be implemented by a single ROM of wider word-width, so as to share a single address decoder (inside the ROM) among multiple look-up tables using the same address generation counter 840.

In conclusion, the invention provides novel systems, circuits, methods and arrangements for decoding and correcting errors. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A low density parity check (LDPC) decoder, the LDPC decoder comprising:
an arithmetic unit including a reconfigurable hardware circuit, wherein the reconfigurable hardware circuit is selectably operable to perform a row update, a column update and a load/unload function.

2. The LDPC decoder of claim 1, wherein the LDPC decoder further comprises a memory unit communicably coupled to the arithmetic unit.

3. The LDPC decoder of claim 2, wherein the load/unload function is operable to simultaneously load soft inputs to a memory unit, and to unload soft outputs from the memory unit.

4. The LDPC decoder of claim 2, wherein the memory unit includes a dual port RAM, a counter and an address look-up table.

5. The LDPC decoder of claim 4, wherein during the column update, the dual port RAM is addressed directly from the counter.

6. The LDPC decoder of claim 4, wherein during the row update, the dual port RAM is addressed indirectly by applying an output from the counter to the address look-up table.

7. The LDPC decoder of claim 1, wherein the LDPC decoder further comprises a soft-input memory communicably coupled to the arithmetic unit.

8. The LDPC decoder of claim 6, wherein the LDPC decoder is operable to receive a set of soft-inputs to both the soft-input memory and the arithmetic unit in parallel.

9. The LDPC decoder of claim 6, wherein the soft-input memory is a FIFO.

10. The LDPC decoder of claim 1, wherein the arithmetic unit includes a look-up table, and wherein the same look-up table is used to perform both the row update function and the column update function.

11. A method for performing low density parity check (LDPC) decoding, the method comprising:
providing an LDPC decoder, wherein the LDPC decoder includes:
an arithmetic unit;
a soft-input memory; and
a memory unit;
configuring the arithmetic unit to perform a row update;
performing the row update;
configuring the arithmetic unit to perform a column update;
performing the column update; and
wherein at least half of the circuitry used to perform the row update is re-used to perform the column update.

12. The method of claim 11, wherein the method further comprises:
configuring the arithmetic unit to perform a load/unload function; and wherein at least some of the circuitry used to perform the row update is re-used to perform the load/unload function.

13. The method of claim 12, wherein the method further comprises:
simultaneously loading soft-inputs into the memory unit and unloading soft-outputs from the memory unit.

14. The method of claim 11, wherein the memory unit includes a dual port RAM, and wherein performing a row update includes reading information from the memory unit using a counter to directly address the dual port RAM.

15. The method of claim 14, wherein the memory unit further includes an address look-up table, and wherein performing a column update includes reading information from the memory unit using a counter to indirectly address the dual port RAM via the address look-up table.

16. The method of claim 11, wherein configuring the arithmetic unit to perform the row update includes selectably asserting inputs to one or more multiplexers of a reconfigurable hardware circuit.

17. The method of claim 11, wherein configuring the arithmetic unit to perform the column update includes selectably asserting inputs to one or more multiplexers of a reconfigurable hardware circuit.

18. The method of claim 11, wherein the arithmetic unit includes a look-up table, and wherein configuring the arithmetic unit to perform a row update and configuring the arithmetic unit to perform a column update result in using the same look-up table for both the column update and the row update.

19. A decoder circuit, the circuit comprising:
a soft-input memory;
a memory unit; and
an arithmetic unit, wherein the arithmetic unit includes a hardware circuit that is selectably operable to perform a row update and a column update, and wherein at least half of the circuitry of the hardware circuit used to perform the row update is re-used to perform the column update.

20. The circuit of claim 19, wherein the hardware circuit is further selectably operable to perform a load/unload function, and wherein the load/unload function includes a simultaneous loading of soft-inputs into the memory unit and unloading soft-outputs from the memory unit.

21. The decoder of claim 1, wherein the decoder is implemented as part of a device selected from a group consisting of: a storage device, and a transmission device.

22. The decoder circuit of claim 19, wherein the decoder circuit is implemented as part of a device selected from a group consisting of: a storage device, and a transmission device.

23. The decoder circuit of claim 19, wherein the decoder circuit is implemented as part of an integrated circuit.

* * * * *